(12) United States Patent
Carter et al.

(10) Patent No.: US 8,445,344 B2
(45) Date of Patent: May 21, 2013

(54) UNIFORM HIGH-K METAL GATE STACKS BY ADJUSTING THRESHOLD VOLTAGE FOR SOPHISTICATED TRANSISTORS BY DIFFUSING A METAL SPECIES PRIOR TO GATE PATTERNING

(75) Inventors: Richard Carter, Dresden (DE); Falk Graetsch, Dresden (DE); Martin Trentzsch, Dresden (DE); Sven Beyer, Dresden (DE); Berthold Reimer, Dresden (DE); Robert Binder, Dresden (DE); Boris Bayha, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 233 days.

(21) Appl. No.: 12/787,461

(22) Filed: May 26, 2010

(65) Prior Publication Data

US 2010/0327373 A1 Dec. 30, 2010

(30) Foreign Application Priority Data

Jun. 30, 2009 (DE) .......................... 10 2009 031 155

(51) Int. Cl.
*H01L 21/3205* (2006.01)
*H01L 21/4763* (2006.01)
*H01L 21/8238* (2006.01)

(52) U.S. Cl.
USPC .... 438/216; 438/287; 438/591; 257/E21.639; 257/E21.625

(58) Field of Classification Search
USPC .. 438/287, 199–233, 587, 591; 257/E21.625, 257/E21.639
See application file for complete search history.

(56) References Cited

U.S. PATENT DOCUMENTS

| 6,184,072 | B1* | 2/2001 | Kaushik et al. | 438/197 |
| 7,265,428 | B2* | 9/2007 | Aoyama | 257/413 |
| 7,291,526 | B2* | 11/2007 | Li | 438/197 |
| 7,291,527 | B2* | 11/2007 | Chambers et al. | 438/197 |
| 7,504,700 | B2* | 3/2009 | Zhu et al. | 257/410 |
| 7,629,212 | B2* | 12/2009 | Ramin et al. | 438/199 |
| 7,772,073 | B2* | 8/2010 | Clark et al. | 438/287 |
| 7,972,950 | B2* | 7/2011 | Na et al. | 438/591 |
| 8,357,604 | B2* | 1/2013 | Hoentschel et al. | 438/592 |
| 2007/0111448 | A1 | 5/2007 | Li et al. | 438/264 |
| 2008/0079086 | A1 | 4/2008 | Jung et al. | 257/369 |
| 2009/0098693 | A1 | 4/2009 | Nakajima | 438/199 |

(Continued)

FOREIGN PATENT DOCUMENTS

WO WO 2009/072421 A1 6/2009

OTHER PUBLICATIONS

PCT Search Report and Written Opinion from PCT/US2010/038923 dated Oct. 13, 2010.
Translation of Official Communication from German Patent Office for German Patent Application No. 10 2009 031 155.6 dated Aug. 6, 2010.

*Primary Examiner* — Steven J Fulk
*Assistant Examiner* — Eric Ward
(74) *Attorney, Agent, or Firm* — Williams, Morgan & Amerson, P.C.

(57) ABSTRACT

Sophisticated gate electrode structures for N-channel transistors and P-channel transistors are patterned on the basis of substantially the same configuration while, nevertheless, the work function adjustment may be accomplished in an early manufacturing stage. For this purpose, diffusion layer and cap layer materials are removed after incorporating the desired work function metal species into the high-k dielectric material and subsequently a common gate layer stack is deposited and subsequently patterned.

21 Claims, 6 Drawing Sheets

U.S. PATENT DOCUMENTS

| | | | |
|---|---|---|---|
| 2009/0108294 A1 | 4/2009 | Choi et al. | 257/190 |
| 2009/0114996 A1* | 5/2009 | Inumiya et al. | 257/369 |
| 2010/0001348 A1 | 1/2010 | Mitsuhashi et al. | 257/368 |
| 2010/0219481 A1* | 9/2010 | Tseng et al. | 257/369 |

* cited by examiner

UNIFORM HIGH-K METAL GATE STACKS BY ADJUSTING THRESHOLD VOLTAGE FOR SOPHISTICATED TRANSISTORS BY DIFFUSING A METAL SPECIES PRIOR TO GATE PATTERNING

BACKGROUND OF THE INVENTION

1. Field of the Invention

Generally, the present disclosure relates to the fabrication of sophisticated integrated circuits including advanced transistor elements that comprise complex gate electrode structures including a sophisticated gate dielectric, such as a high-k gate dielectric, and a metal-containing electrode material.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed between the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity, which in turn causes an increase of gate resistivity due to the reduced dimensions, is a dominant design criterion for accomplishing an increase in the operating speed of the integrated circuits.

Presently, the vast majority of integrated circuits are based on silicon due to its substantially unlimited availability, the well-understood characteristics of silicon and related materials and processes and the experience gathered during the last 50 years. Therefore, silicon will likely remain the material of choice for future circuit generations produced by volume production techniques. One reason for the dominant role of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, during anneal cycles to activate dopants and to cure crystal damage without sacrificing the electrical characteristics of the interface.

For the reasons pointed out above, in field effect transistors, silicon dioxide is preferably used as a base material for a gate insulation layer that separates the gate electrode, frequently comprised of polysilicon and metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a very pronounced dependence of the threshold voltage on the channel length. Aggressively scaled transistor devices with a relatively low supply voltage and thus reduced threshold voltage may suffer from an exponential increase of the leakage current, while also requiring enhanced capacitive coupling of the gate electrode to the channel region. Thus, the thickness of the silicon dioxide layer has to be correspondingly decreased to provide the required high capacitance between the gate and the channel region. For example, a channel length of approximately 80 nm may require a gate dielectric made of silicon dioxide as thin as approximately 1.2 nm. Although, the usage of high speed transistor elements having an extremely short channel may be restricted to high speed signal paths, whereas transistor elements with a longer channel may be used for less critical circuit portions, such as storage transistor elements, the relatively high leakage current caused by direct tunneling of charge carriers through an ultra-thin silicon dioxide gate insulation layer may reach values for an oxide thickness in the range of 1-2 nm that may not be compatible with requirements for performance driven circuits, even if only transistors in speed critical paths are formed on the basis of an extremely thin gate oxide.

Therefore, various measures have been proposed for increasing the dielectric strength and the effective dielectric constant of the silicon dioxide material, such as performing treatments on the basis of nitrogen in order in incorporate a certain amount of nitrogen. Although these treatments of the base oxide material provide significant improvements, further scaling of the transistor dimensions may demand even further sophisticated approaches. To this end, replacing silicon dioxide as the material for gate insulation layers has been considered, particularly for extremely thin silicon dioxide based gate layers. Possible alternative materials include materials that exhibit a significantly higher permittivity so that a physically greater thickness of a correspondingly formed gate insulation layer provides a capacitive coupling that would be obtained by an extremely thin silicon dioxide based layer. It has thus been suggested to replace at least a portion of the conventional silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides an increased capacitance based on the same or greater thickness as a silicon dioxide based layer, while additionally maintaining leakage currents at an acceptable level. On the other hand, the non-polysilicon material, such as titanium nitride and the like, may be formed so as to connect to the high-k dielectric material, thereby substantially avoiding the presence of a depletion zone.

Since the threshold voltage of sophisticated transistor elements strongly depends on the work function of the gate electrode material, which in turn is significantly determined by the characteristics of the dielectric gate material, an appropriate adaptation of the electronic characteristics may typically have to be performed in order to obtain the desired work function values for P-channel transistors and N-channel transistors, respectively. For this purpose, typically, appropriate metal species may be provided in the vicinity of the gate dielectric material and may be diffused towards and into the gate dielectric material at any appropriate manufacturing stage so as to obtain a desired value of the resulting work function. Consequently, different metal species may be required to be positioned in the vicinity of the gate dielectric material, which may generally result in a very complex manufacturing sequence. For example, in some conventional approaches, the adjustment of the work function and the formation of the actual electrode material is accomplished in an early manufacturing stage, that is, upon patterning the gate electrode structure, which may result in a very complex gate layer stack, since a plurality of diffusion and cap layers may have to be provided in a different composition in the gate electrodes of P-channel transistors and N-channel transistors, and the required diffusion may be initiated during the high temperature anneal processes that are typically applied upon activating the dopants in the drain and source regions and re-crystallizing implantation-induced damage. In other conventional approaches, the manufacturing process may be performed on the basis of a significantly less complex gate layer stack by omitting any diffusion and cap layers in the gate electrode, thereby providing a substantially uniform process sequence with respect to N-channel transistors and P-channel transistors, wherein, however, in a very advanced manufacturing stage, the corresponding placeholder materials, such as polysilicon, have to be removed and replaced by appropriate work function metals and electrode metals, which are different for the P-channel transistors and N-channel transistors, thereby also requiring a very complex process sequence in an advanced manufacturing stage. Consequently, omitting the diffusion layers and cap layers at an early manufacturing stage, i.e., after providing the high-k dielectric material, in a so-called replacement gate approach is associated with a very complex process sequence in a very advanced manufacturing stage, while significant irregularities and thus transistor variabilities may also be introduced during the process sequence for exposing the placeholder material, removing the same and forming different types of work function metals and metal-containing electrode materials. On the other hand, adjusting the work function at an early manufacturing stage may result in a very complex and different structure of the gate electrodes, as will be explained with reference to FIG. 1

FIG. 1 schematically illustrates a cross-sectional view of a semiconductor device 100 comprising a substrate 101, above which is formed a semiconductor layer 102 in which a first active region 102A and a second active region 102B are provided, for instance, delineated by an isolation structure (not shown). Typically, the semiconductor layer 102 represents a silicon material which, in the manufacturing stage shown, may comprise appropriate dopant species in order to define the basic transistor characteristics, such as conductivity type and the like. Furthermore, the first active region 102A, which represents a P-channel transistor, may additionally comprise, at least partially, above the basic active region 102A, a threshold adjusting semiconductor alloy 102D, for instance in the form of a silicon/germanium material, in order to provide an additional valence band offset to obtain a desired threshold in combination with the work function to be adjusted for a gate electrode structure 135A. The gate electrode structure 135A comprises a gate dielectric material 110, which may comprise a "conventional" gate dielectric material 111 in the form of a silicon oxide based material, such as a silicon oxynitride and the like, followed by a high-k dielectric material 112, such as hafnium oxide, hafnium silicon oxide and the like, as is also explained above. Moreover, the gate electrode structure 135A comprises a plurality of cap and diffusion layers, such as a titanium nitride layer 122 and a diffusion layer 123, which may comprise an appropriate metal species, such as aluminum, followed by a further cap layer, i.e., a titanium nitride layer 121. Additionally, a further diffusion layer 126, such as a lanthanum layer, is provided in combination with a titanium nitride cap layer 127, wherein the layers 126, 127 may represent materials as are required for a gate electrode structure 135B of an N-channel transistor to be formed in and above the second active region 102B. Finally, the gate electrode structure 135A may comprise an amorphous or polycrystalline silicon material 114 and 115, depending on the overall process strategy. Similarly, the gate electrode structure 135B may comprise the gate dielectric materials 111 and 112 followed by the diffusion layer 126, i.e., the lanthanum layer, in combination with the titanium nitride layer 127 followed by the silicon layers 114 and 115. Consequently, due to the plurality of cap layers and diffusion layers, the gate electrode structures 135A, 135B may have a very different configuration caused by the preceding manufacturing process. That is, typically, the gate dielectric material 110 is provided by oxidation and deposition techniques in combination with any other appropriate surface treatments and the like, followed by the deposition of a layer system comprising the layers 123, 122 and 121, which is subsequently selectively removed from above the second active region 102B by providing an etch mask and removing the materials selectively with respect to a gate dielectric material 110. Thereafter, the layers 126 and 127 are deposited, followed by the deposition of the silicon materials 114 and 115. Thereafter, a very complex patterning sequence has to be performed on the basis of sophisticated lithography and etch techniques, wherein the gate electrode structures 135A, 135B may differ in height and configuration, thereby contributing to process and device variabilities. For example, in semiconductor devices with a gate length, i.e., in FIG. 1 the horizontal extension of the gate electrode structures 135A, 135B, of 40 nm and less, material residues may be observed at the foot of the gate electrode structure 135A, while the structure 135B may suffer from additional undercut, depending on the corresponding process treatments. Hence, upon continuing the further manufacturing process for completing the transistors in and above the active regions 102A, 102B, even further increased process-related irregularities may be introduced. Finally, after forming drain and source regions, the subsequent annealing process may result in a diffusion of metal species of the layer 123 towards the gate dielectric material 110 via the cap layer 123 in order to obtain the desired work function, while, in the gate electrode structure 135B, the lanthanum species in the layer 126 may diffuse into the dielectric material 110.

Although the manufacturing strategy described with reference to FIG. 1 may principally result in sophisticated transistor elements, it turns out that, in volume production, the process-related irregularities may contribute to a significant yield loss, thereby making this approach less than desirable.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques and semiconductor devices in which the work function and thus the threshold of transistors of different conductivity type may be adjusted on the basis of appropriate diffusion and cap layers, which may be removed prior to providing a metal-containing electrode material, which may then be applied for both types of gate electrode structures in a common process. Consequently, the same configuration may be obtained for the gate electrode structures of N-channel transistors and P-channel transistors, thereby significantly reducing complexity of the gate patterning process. For this purpose, an anneal process may be performed on the basis of the cap and diffusion layers prior to the deposition of the electrode material and these metal-containing materials may be removed on the basis of an appropriate etch chemistry, such as wet chemical etch recipes, in order to provide similar conditions for the subsequent deposition of the electrode material, possibly in combination with a semiconductor material, such as silicon and the like. Upon appropriately dimensioning material characteristics of the cap and diffusion layers, such as material composition, layer thickness and the like, a desired degree of flexibility in obtaining the desired work functions may be achieved, wherein different "flavors" of transistors may be provided by appropriately selecting the composition of the cap and diffusion layer stack in different device areas. Furthermore, in some illustrative aspects disclosed herein, a semiconductor material may be replaced by a metal-containing electrode material in a very advanced manufacturing stage, which may be accomplished in a common process sequence, since the basic transistor characteristics have already been adjusted in the early manufacturing stage. Consequently, upon setting the work function values for different transistor types in an early manufacturing stage, the transistor characteristics in terms of threshold voltage may be decoupled from process conditions established during an anneal process for activating the drain and source regions, which may, in sophisticated applications, due to the demand to reduce anneal temperatures, require significant process adaptations for providing diffusion and cap layers in conventional strategies in which the final threshold adjustment may be accomplished on the basis of the drain and source activation anneal process.

One illustrative method disclosed herein comprises forming a gate dielectric material above a first active region and a second active region of a semiconductor device. The method further comprises forming a first metal-containing material selectively above the first active region and forming a second metal-containing material above the second active region. The method also comprises performing a heat treatment so as to initiate diffusion of a first species from the first metal-containing material into the gate dielectric material above the first active region and to initiate diffusion of a second species from the second metal-containing material into the gate dielectric material above the second active region. Next, the first and second metal-containing materials are removed and a gate electrode material is formed above the gate dielectric material after removing the first and second metal-containing materials. Additionally, the method comprises forming a first gate electrode structure above the first active region and a second gate electrode structure above the second active region from the gate electrode material.

A further illustrative method disclosed herein relates to forming gate electrode structures of a semiconductor device. The method comprises diffusing an aluminum metal species into a first portion of a gate dielectric material and a lanthanum metal species into a second portion of the gate dielectric material, wherein the first portion of the gate dielectric material is formed above a first active region and the second portion is formed above a second active region. The method further comprises removing material from above the first and second portions of the gate dielectric material after diffusing the aluminum metal species and the lanthanum metal species, wherein the material comprises the aluminum metal species and the lanthanum metal species. The method additionally comprises forming an electrode material commonly above the first and second portions of the gate dielectric material. Finally, the method comprises forming a first gate electrode structure from the electrode material and the first portion of the gate dielectric material and forming a second gate electrode structure from the electrode material and the second portion of the gate dielectric material.

One illustrative semiconductor device disclosed herein comprises a first active region and a first gate electrode structure formed on the first active region, wherein the first gate electrode structure comprises a dielectric base material and a high-k dielectric material formed on the dielectric base material, wherein the high-k dielectric material comprises a first threshold adjusting metal species. The semiconductor device further comprises a second active region and a second gate electrode structure formed on the second active region. The second gate electrode structure comprises the dielectric base material and the high-k dielectric material formed on the dielectric base material, wherein the high-k dielectric material comprises a second threshold adjusting metal species. Additionally, the semiconductor device comprises a first metal-containing electrode material that is formed on the high-k dielectric material in the first and second gate electrode structures. Additionally, a second metal-containing electrode material is formed on the first metal-containing electrode material.

BRIEF DESCRIPTION OF THE DRAWINGS

The disclosure may be understood by reference to the following description taken in conjunction with the accompanying drawings, in which like reference numerals identify like elements, and in which:

FIGS. 2i-2k schematically illustrate cross-sectional views of the semiconductor device according to still further illustrative embodiments in which transistors of different final configuration are obtained on the basis of an early adjusted threshold voltage based on diffusion in cap layers which are removed prior to patterning the gate electrode structures.

Figure 1:
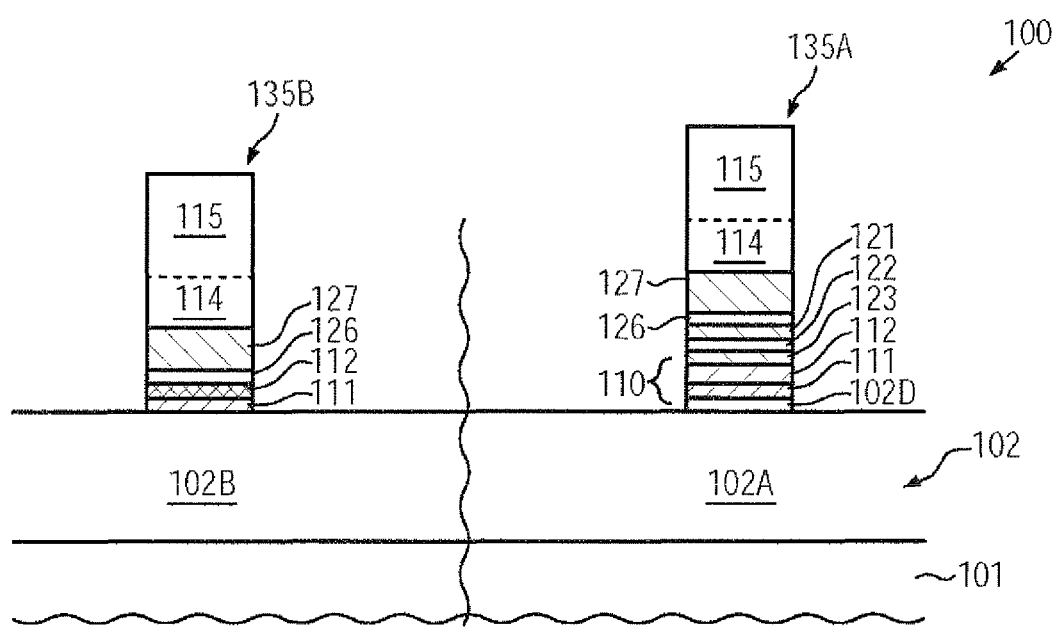
FIG. 1 schematically illustrates a cross-sectional view of a semiconductor device including sophisticated gate electrode structures of an N-channel transistor and a P-channel transistor including a plurality of diffusion and cap layers, in accordance with conventional process strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and techniques in which sensitive gate dielectric materials may be treated to receive an appropriate species for adjusting the work function and thus the threshold voltage and the like prior to actually forming the gate electrode structures, which may be accomplished by providing appropriate materials in the form of diffusion layers and cap layers that enable respective work function adjusting metal species to diffuse into the dielectric material, which may be provided in the form of a high-k dielectric material and/or a silicon oxide based material, and by removing these materials prior to actually depositing an electrode material, such as a metal-containing electrode material, possibly in combination with a semiconductor material. In this manner, the work function may basically be set in an early manufacturing stage, thereby providing the possibility of obtaining a gate layer stack having substantially the same configuration for both types of transistor, which may thus result in superior process conditions during the subsequent complex patterning process. Consequently, process-related irregularities may be significantly reduced, thereby making this approach very advantageous in volume production strategies, since the desired transistor characteristics may be achieved with a high degree of reliability and uniformity. Additionally, due to "stabilizing" the work function characteristics in an early manufacturing stage by diffusion using an anneal process with appropriate temperatures, the influence of an anneal process for activating the drain and source regions may be less pronounced, thereby achieving a certain degree of independence between the dopant activation and the work function characteristics, which may be highly advantageous in process strategies which may demand reduced anneal temperatures in the drain and source regions since significant modifications in the preceding gate patterning sequence may not be required. Additionally, in some illustrative embodiments disclosed herein, a desired metal-containing electrode material or any other desired electrode material may be incorporated in a very late manufacturing stage on the basis of significantly less critical process conditions, since a single metal may be applied in both types of transistors, since the basic characteristics thereof are already set in an earlier manufacturing stage. Thus, a desired high conductivity of the gate electrode structures may be accomplished by replacing a placeholder material, such as a silicon material, in a very advanced manufacturing stage without requiring the deposition of different types of metal species, as may typically be required in conventional "replacement gate approaches."

With reference to FIGS. 2a-2k, further illustrative embodiments will now be described in more detail, wherein reference may also be made to FIG. 1 if appropriate.

Figure 2A:
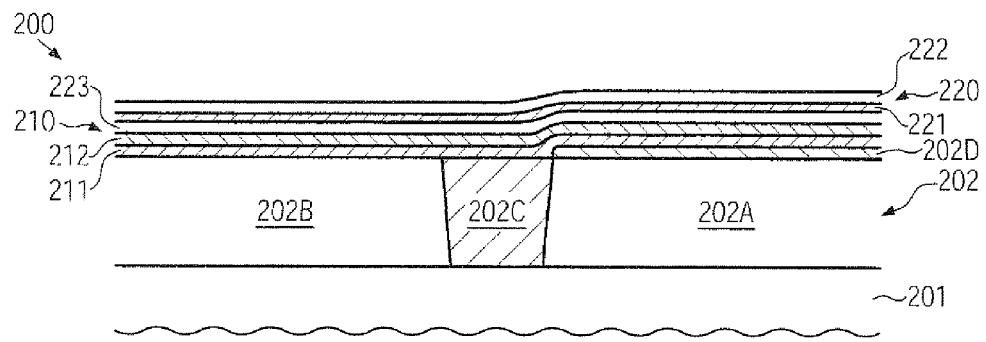
FIGS. 2a-2i schematically illustrate cross-sectional views of a semiconductor device during various manufacturing stages in forming gate electrode structures of different transistor types by adjusting the threshold voltage prior to patterning the gate electrode structures, according to illustrative embodiments.

FIG. 2a schematically illustrates a cross-sectional view of a semiconductor device 200 which may comprise a substrate 201 above which may be formed a semiconductor layer 202. The substrate 201 and the semiconductor layer 202 may represent any appropriate materials for forming therein and thereabove circuit elements, such as transistors and the like. For example, a buried insulating layer may be formed on a substantially crystalline substrate material followed by the semiconductor layer 202, thereby forming a silicon-on-insulator (SOI) configuration. The semiconductor material 202 may represent any appropriate material, such as a silicon material, possibly in combination with other components, such as germanium, carbon and the like, in order to adjust the desired transistor characteristics. Moreover, an isolation structure 202C may laterally delineate a first active region 202A and a second active region 202B in the semiconductor layer 202. For example, the first active region 202A may represent an N-doped well region in and above which a P-channel transistor is to be formed during the further processing. Similarly, the active region 202B may represent the active region of an N-channel transistor. It should be appreciated, however, that the following sequence of processes may also be applied to a configuration in which the active region 202A may represent an N-channel transistor, while the active region 202B may represent a P-channel transistor. Furthermore, in the embodiment shown, the active region 202A may comprise a threshold adjusting semiconductor alloy 202D, for instance in the form of a silicon/germanium alloy, having a specified thickness and germanium concentration in order to provide a required valence band offset to adjust, in combination with an appropriate work function to be adjusted in the subsequent manufacturing sequence, the threshold voltage of a transistor to be formed in and above the active region 202A.

Moreover, in the manufacturing stage shown, a gate dielectric material 210 may be formed above the first and second active regions 202A, 202B, followed by a layer stack 220 including "cap layers" in combination with a diffusion layer 221. In the embodiment shown, the dielectric material 210 may comprise a dielectric base layer 211, such as a silicon dioxide based material in the form of a silicon oxynitride material and the like. Moreover, a high-k dielectric material layer 212 may be provided in the gate dielectric material 210. For this purpose, any appropriate material as specified above may be used as a high-k dielectric material. It should be appreciated, however, that the dielectric material 210 may be provided in the form of a single material layer or may comprise three or more sub-layers, if required. The layer stack 220 may comprise the cap layers 223 and 222 in the form of any appropriate material, such as a titanium nitride material, while the diffusion layer 221 may comprise a metal species that is appropriate for adjusting the work function of a gate electrode structure to be formed above the active region 202A. For example, the diffusion layer 221 may be provided in the form of an aluminum layer or a material layer comprising a high concentration of aluminum atoms. It should be appreciated that the diffusion characteristics during a subsequent anneal process may be adjusted on the basis of the material composition and layer thickness of the layer stack 220, which in one illustrative embodiment may comprise the cap layer 223 with a thickness of 0-30 Å, while the top cap layer 222 may be provided with a thickness of approximately 0-100 Å. That is, in some cases, one or both of the layers 222, 223 may be omitted, if considered appropriate, while in other cases any appropriate thickness value in the above-specified range may be selected in relation to process parameters of an anneal process still to be formed. Moreover, the diffusion layer 221 may have a thickness of approximately 1-20 Å for a material layer including an aluminum species.

The semiconductor device 200 as illustrated in FIG. 2a may be formed on the basis of the following processes. After forming the isolation structure 202C, the basic dopant profile of the active regions 202A, 202B may be established by using appropriate masking regimes in combination with implantation processes. Thereafter, the semiconductor alloy 202D, if required, may be selectively formed on the active region 202A, which may be accomplished by using selective epitaxial growth techniques in combination with an appropriate masking regime for covering the active region 202B during the deposition process. Next, the gate dielectric material 210 may be formed in any appropriate manner, for instance by performing an oxidation process for forming a silicon oxide based base material, while in other cases chemical oxidation processes, deposition and the like may be applied. If required, any further surface treatments and the like may be performed in order to appropriately adjust the composition of the base layer 211, which may have a thickness of approximately 1 Å and less. Thereafter, the high-k dielectric material may be deposited by using any well-established chemical vapor deposition (CVD) techniques, physical vapor deposition (PVD) techniques and the like. Thereafter, the layer stack 220 may be deposited on the basis of well-established process techniques in which deposition parameters are controlled so as to obtain the desired material composition and thickness, as is specified above.

Figure 2B:
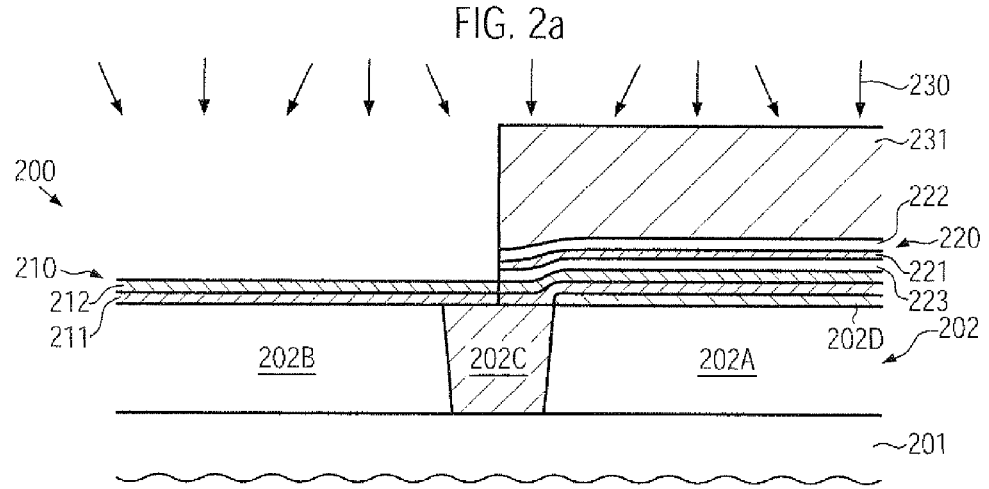

FIG. 2b schematically illustrates the semiconductor device 200 when exposed to an etch ambient 230 for selectively removing the layer stack 220 from above the active region 202B on the basis of an etch mask 231, such as a resist mask, possibly in combination with other appropriate materials. The etch process 230 may be performed on the basis of any appropriate etch chemistry for removing the layer stack 220, for instance by using a wet chemical etch recipe based on an ammonium peroxide mixture (APM), which may efficiently remove materials such as titanium nitride and the like, in combination with the diffusion layer 221, while stopping at the dielectric material 210, as, for instance, a plurality of high-k dielectric materials may exhibit superior etch stop capabilities with respect to a plurality of etch recipes. Thus, the dielectric gate material 210, i.e., the layer 212, may be exposed during the etch process 230.

Figure 2C:
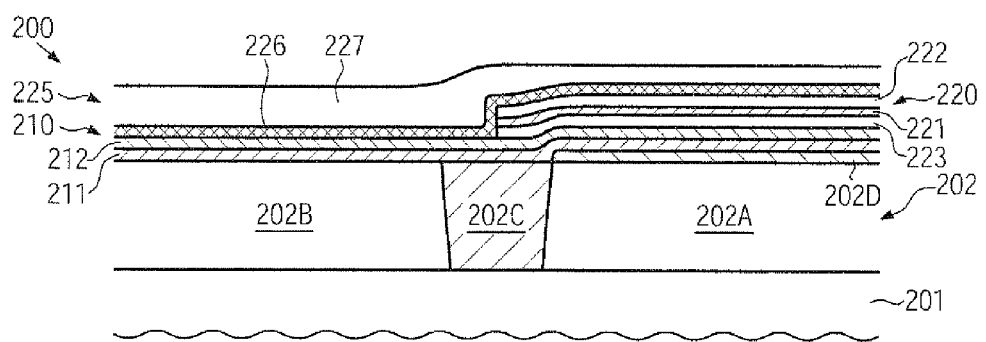

FIG. 2c schematically illustrates the semiconductor device 200 with a further layer stack 225 formed above the active regions 202A, 202B. The layer stack 225 may have any appropriate configuration for providing a diffusion species in a diffusion layer 226, possibly in combination with one or more additional cap layers 227. For example, the layer 226 may include a metal species that may enable an appropriate adjustment of the threshold voltage of a transistor to be formed in and above the active region 202B. In one embodiment, the diffusion layer 226 may comprise lanthanum, which may represent an appropriate candidate for adjusting the work function in an N-channel transistor. The additional cap layer 227 may comprise titanium nitride or any other appropriate material composition. With respect to any process techniques for forming the layer stack 225, it may be referred to the layer stack 220.

Figure 2D:
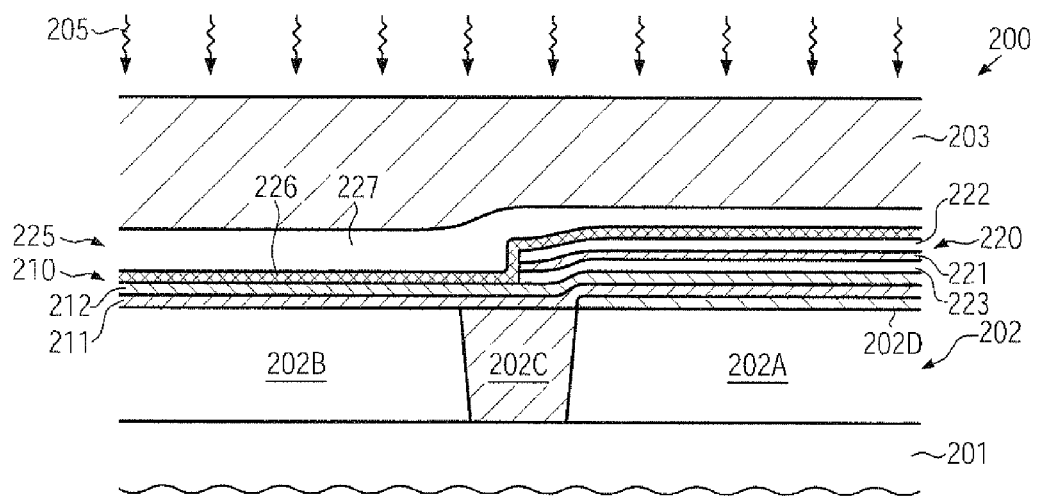

FIG. 2d schematically illustrates the semiconductor device 200 in a further advanced manufacturing stage. As illustrated, a protection layer 203, for instance comprised of silicon or any other appropriate material, may be formed above the layer stack 225. It should be appreciated that, in other illustrative embodiments, the protection layer 203 may be omitted when this is considered appropriate for performing a subsequent anneal process. Furthermore, the device 200 may be subjected to an anneal process 205 at elevated temperatures in the range of approximately 800-1200° C., while, in other cases, a temperature of approximately 900° C. and higher may be applied. During the anneal process 205, which may be performed on the basis of a rapid thermal anneal (RTA) process condition (in other cases, other anneal strategies may be applied, such as laser-based anneal processes, flashlight-based anneal processes and the like), diffusion of the metal-containing species in the diffusion layers 221 and 226 may be initiated so as to migrate towards and into the dielectric material 210. Consequently, a species of the layer 226, such as lanthanum, may efficiently diffuse into the dielectric material 210 above the active region 202B, while a corresponding lanthanum diffusion may be suppressed in the layer 222 of the layer stack 220 formed above the active region 202A. On the other hand, the aluminum species in the layer 221 may efficiently diffuse to the portion of the dielectric material 210 positioned above the active region 202A. In this manner, the threshold voltage adjustment for different transistor types may be accomplished during the anneal process 205. As previously discussed, the diffusion conditions may be individually adapted for the diffusion layers 221 and 226 by appropriately selecting the material composition and thickness thereof in combination with selecting appropriate materials and layer thickness values for the cap layers 223 and 222 in the layer stack 220 and the cap layer 227 of the layer stack 225. For example, the diffusion layer 226 may be provided with a thickness of approximately 1-20 Å, for instance, when including a lanthanum species, while the cap layer 227 may be provided with a thickness of approximately 0-100 Å, for instance, for a titanium nitride material.

For example, the thickness of the cap layer 223 may have a strong influence on the diffusion behavior of the species in the diffusion layer 221, thereby also significantly influencing the finally obtained threshold voltage of the corresponding transistor. For example, by reducing the thickness of the layer 223, thereby increasing the amount of metal species incorporated into the portion of the dielectric material 210 positioned above the first active region 202A, a more favorable shifting of the threshold voltage of P-channel transistors may result. Similarly, increasing thickness of the diffusion layer 221 may also result in an increased amount of metal species in the gate dielectric material 210 above the active region 202A, thereby also resulting in a favorable shift of the resulting threshold voltage. On the other hand, the thickness of the cap layer 222 may have no significant influence on the amount of the species of the diffusion layer 221 that is incorporated in the dielectric material 210, but may adjust the "diffusion blocking effect" with respect to the diffusion layer 226, thereby more or less efficiently suppressing the diffusion of this metal species towards the gate dielectric material 210, which may shift away the desired threshold voltage. Similarly, the thickness of the diffusion layer 226 may have an influence on the finally obtained amount of metal species, such as lanthanum, in the portion of the gate dielectric material 210 positioned above the second active region 202B, thereby providing the possibility of adjusting the shifting of the final threshold voltage. On the other hand, the thickness of the cap layer 227 may not substantially influence the diffusion behavior, but may provide superior integrity of the lower lying materials, such as the gate dielectric material 210, in view of providing the protection layer 203, if required.

Consequently, by providing the layer stacks 220 and 225, which may include zero to several cap layers in combination with the corresponding diffusion layers 221 and 226, respectively, a wide variety of threshold voltages may be adjusted in view of a given parameter setting of the anneal process 205. Consequently, the process parameters of the process 205 may be selected such that a sufficient "stabilization" of the adjusted material characteristics in the gate dielectric material 210 above the first and second active regions 202A, 202B may be obtained in order to reduce the influence of any subsequent process steps, such as dopant activation and the like. Furthermore, the layer stacks 220 and/or 225 may be provided with different characteristics, i.e., different numbers of material layers, different thickness values, different material composition in different device areas, thereby enabling the adjustment of different "flavors" of transistors by providing different threshold voltages. For this purpose, any appropriate masking regime may be applied, for instance, by removing a certain layer stack or a portion thereof from above some device areas, while maintaining the layer stack in other device areas and forming one or more further layer stacks, as is described above with reference to the layer stacks 220 and 225.

In other cases, the anneal process 205 may be applied by using locally different anneal conditions, for instance with respect to temperature, which may be accomplished on the basis of sophisticated laser-based techniques and the like, in which the energy deposition may be locally varied so as to obtain different effective anneal temperatures and/or exposure times. In other cases, the characteristics of the protection layer 203 may spatially vary, thereby also varying the local anneal conditions during laser-based or flashlight-based anneal techniques.

It should be appreciated that, during the anneal process 205, the characteristics of the base layer 211 may also be adjusted by incorporating a corresponding metal species in order to set the desired transistor characteristics.

Figure 2E:
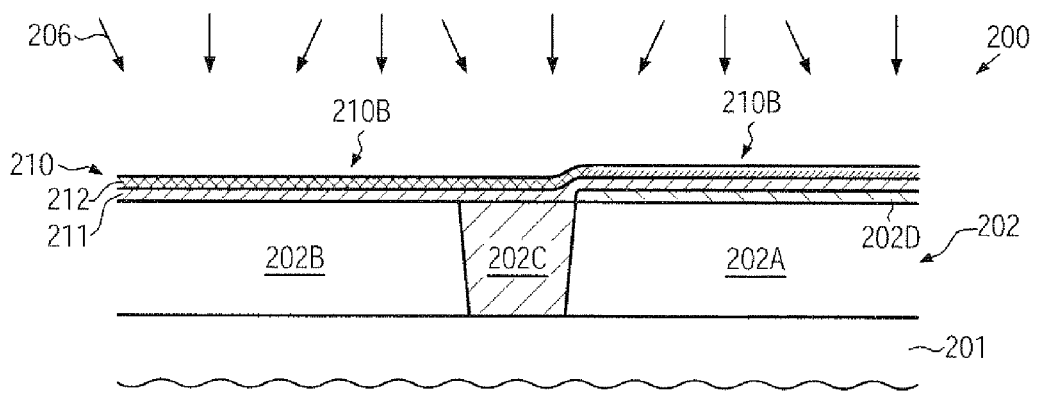

FIG. 2e schematically illustrates the semiconductor device 200 when exposed to a sequence of etch processes 206, during which the protection layer 203 and the layer stacks 225 and 220 (see FIG. 2d) may be removed, thereby exposing the gate dielectric material 210 having the different material composition above the active regions 202A, 202B, as indicated by the portions 210A, 210B. During the etch sequence 206, the protection layer 203 (FIG. 2d), when provided, may be removed by any appropriate wet chemical etch recipes, such as ammonium peroxide mixture, TMAH (tetramethyl ammonium hydroxide) and the like, followed by appropriate wet chemical etch chemistries as specified above when referring to the selective removal of the layer stack 220.

Figure 2F:
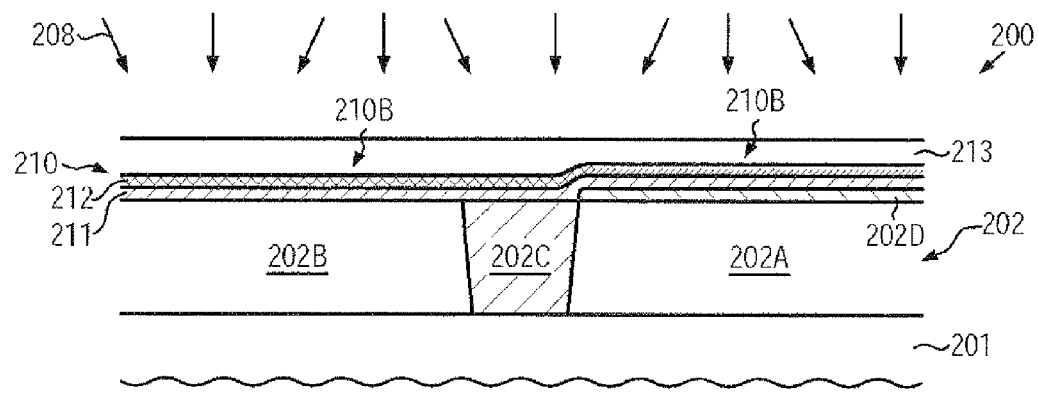

FIG. 2f schematically illustrates the semiconductor device 200 during a deposition process 208 in which a metal-containing electrode material 213 may be formed above the active regions 202A, 202B. That is, the electrode material 213 may, in some illustrative embodiments, be directly formed on the gate dielectric material 210, i.e., on the corresponding portions 210A, 210B of different characteristics without requiring different work function metals, as may be the case in conventional approaches, thereby resulting in a complex gate layer stack, as previously discussed with reference to FIG. 1. For example, the common gate electrode material 213 may be provided in the form of titanium nitride and the like with a thickness of 1-10 nm.

Figure 2G:
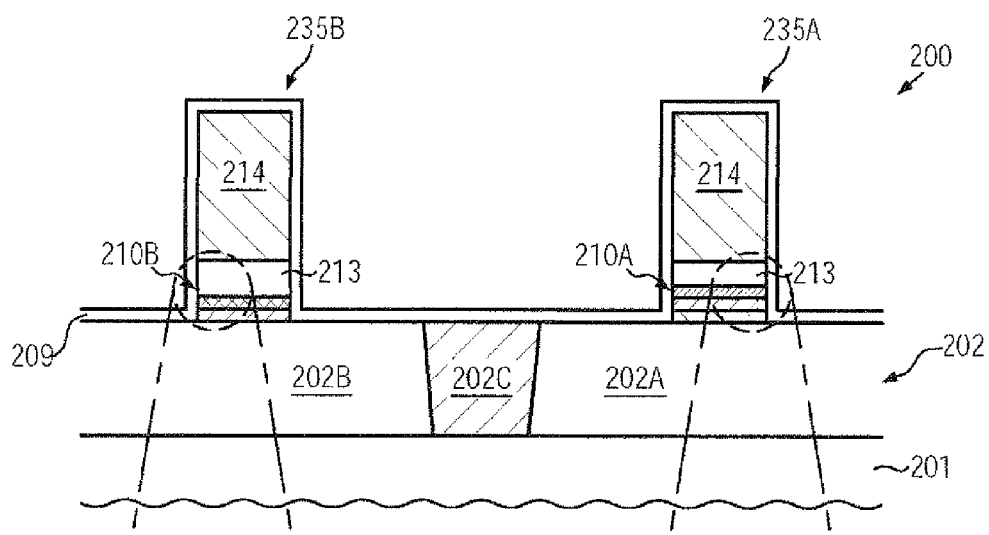

FIG. 2g schematically illustrates the semiconductor device 200 in a further advanced manufacturing stage. As illustrated, a first gate electrode structure 235A may be formed on the active region 202A and may comprise the gate dielectric material 210A followed by the electrode material 213 and a further electrode material 214, which may also include any other materials and the like as may be required for the further processing of the device 200. Similarly, a second gate electrode structure 235B may be formed on the active region 202B and may comprise the gate dielectric material 210B followed by the electrode material 213 and the further electrode material 214. The material 214 may comprise a silicon material, a silicon/germanium material and the like, as required for the further processing of the device 200 and for the desired overall device characteristics. It should be appreciated that, in some illustrative embodiments, the material 214 may be replaced by a highly conductive material, such as a metal in a later manufacturing stage, i.e., after completing the basic transistor configuration in and above the active regions 202A, 202B.

The semiconductor device 200 as illustrated in FIG. 2g may be formed on the basis of appropriate process techniques for forming the metal-containing electrode material 213 and depositing the material 214 and subsequently patterning the resulting layer stack on the basis of sophisticated lithography and etch techniques. Consequently, during the patterning process, substantially identical layer stacks may have to be treated, thereby significantly contributing to the overall reliability and uniformity of the resulting gate electrode structures 235A, 235B. After the patterning process, a protection liner 209 may be formed so as to maintain integrity of sidewalls of the gate electrode structures 235A, 235B during the further processing. The liner 209 may be formed on the basis of any appropriate material, such as silicon nitride and the like.

Figure 2H:
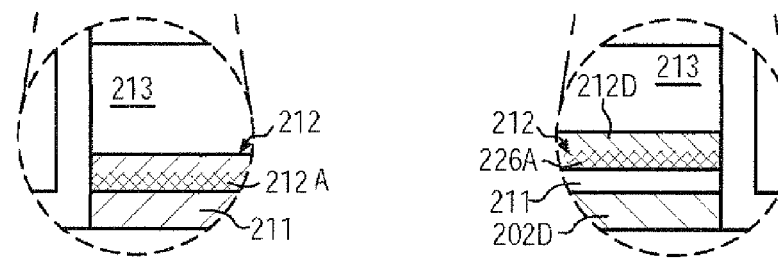

FIG. 2h schematically illustrates a portion of the gate electrode structures 235A, 235B in more detail. As shown, the gate electrode structure 235A may comprise the base layer 211 in combination with the high-k dielectric material 212, wherein at least the layer 212 may have incorporated therein the diffusion species, such as aluminum 226A, which may result, in combination with the semiconductor alloy 202D, in an appropriate threshold voltage for a P-channel transistor. Similarly, the gate electrode structure 235B may comprise the high-k dielectric material 212 formed above the base layer 211, wherein a diffusion species 212A, such as lanthanum and the like, is incorporated to obtain the desired threshold voltage.

As discussed above, if desired, the species 226A and 221A may also be incorporated in the base layer 211, thereby also modifying the characteristics thereof. For example, a silicon dioxide material may be converted into a silicate, thereby increasing the dielectric constant of the base material 211.

Figure 2I:
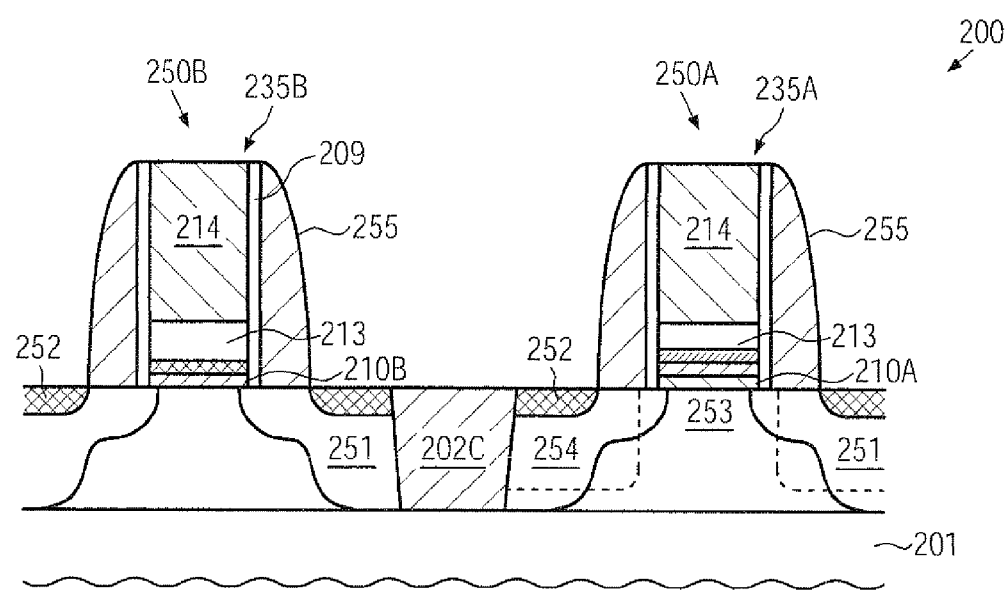

FIG. 2i schematically illustrates the semiconductor device 200 in a further advanced manufacturing stage. As illustrated, a first transistor 250A may be formed on the basis of the gate electrode structure 235A and a second transistor 250B may be formed on the basis of the gate electrode structure 235B. As previously discussed, the transistors 250A, 250B may represent a P-channel transistor and an N-channel transistor, respectively, and comprise drain and source regions 251 having an appropriate vertical and lateral dopant profile in accordance with the desired transistor characteristics. For example, the dopant profile of the drain and source regions 251 may be established on the basis of a spacer structure 255 formed on sidewalls of the gate electrode structures 235A, 235B. Furthermore, metal silicide regions 252 may be formed in the drain and source regions 251. Furthermore, in some illustrative embodiments, one or both of the transistors 250A, 250B may comprise a strain-inducing semiconductor material 254 embedded in the corresponding active region, as is, for instance, shown for the transistor 250A, which may comprise a semiconductor alloy 254, for instance in the form of a silicon/germanium alloy, in order to induce a compressive strain in a channel region 253. In other cases, a corresponding material, such as a silicon/carbon alloy and the like, may be provided in the transistor 250B in order to enhance performance thereof.

The semiconductor device 200 as illustrated in FIG. 2i may be formed on the basis of the following process techniques. After patterning the gate electrode structures 235A, 235B, the semiconductor alloy 254 may be formed, if required, by well-established process techniques in which cavities may be formed in the active region 202A and subsequently filled with the material 254 on the basis of selective epitaxial growth techniques. Thereafter, the drain and source regions may be formed by ion implantation by using the spacer structure 255 as an implantation mask. Thereafter, an anneal process may be performed on the basis of any appropriate process temperatures, wherein, in one illustrative embodiment, the anneal temperature may be less than 900° C. so that the thermal stabilization of the dielectric materials 210A, 210B previously obtained, as described above, may provide stable transistor characteristics, even if anneal parameters during the drain and source activation may have to be re-adjusted for forming semiconductor devices of different characteristics. Similarly, when forming the semiconductor alloy 254, the corresponding elevated temperatures may not significantly influence the characteristics of the gate dielectric materials 210A, 210B.

Figure 2J:
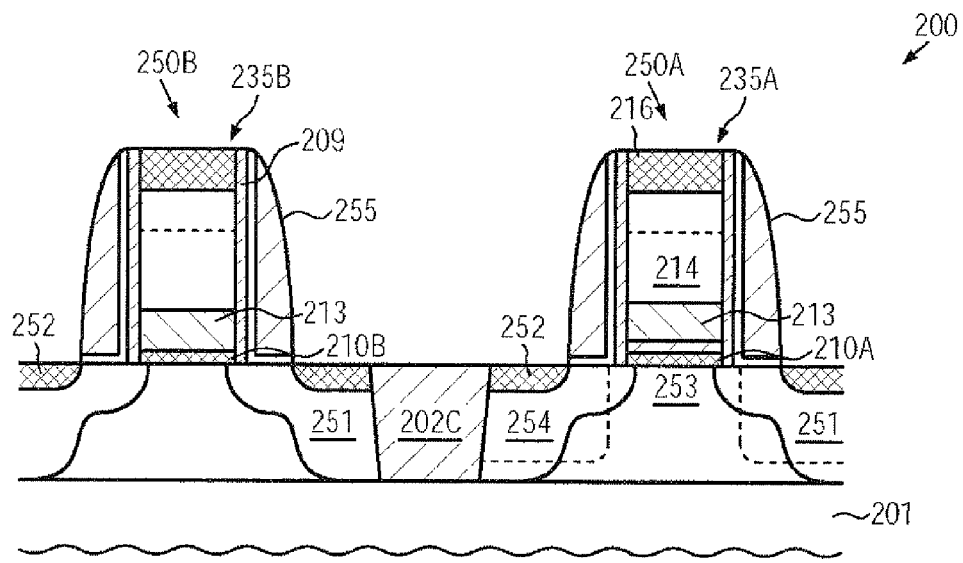

FIG. 2j schematically illustrates the semiconductor device 200 according to further illustrative embodiments in which the gate electrode structures 235A, 235B may comprise metal silicide regions 216, which may be formed commonly with the metal silicide regions 252 or which may be formed in a separate process sequence. Consequently, also in this case, the gate electrode structures 235A, 235B may be formed on the basis of a substantially identical configuration, wherein, at a final stage of completing the transistor configuration, the contact resistivity may further be reduced by providing the metal silicide regions 216.

Figure 2K:
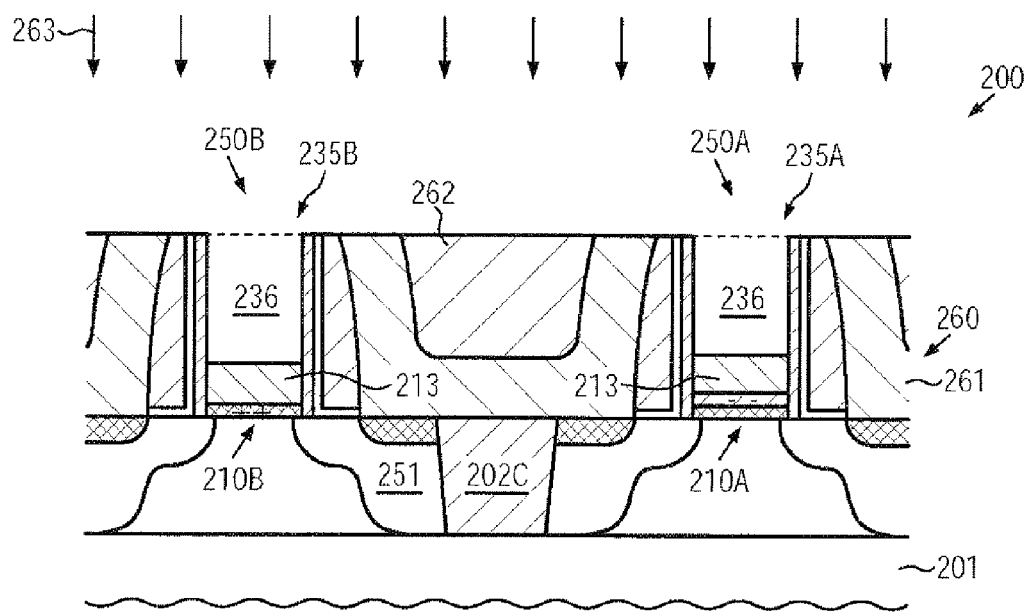

FIG. 2k schematically illustrates the semiconductor device 200 according to still further illustrative embodiments in which a portion of an interlayer dielectric material 260 may be provided so as to laterally enclose the gate electrode structures 235A, 235B. The interlayer dielectric material 260 may comprise a first dielectric material 261, such as a silicon nitride material, a nitrogen-containing silicon carbide material and the like, which may be provided in a highly stressed state, at least locally, if required. Furthermore, a second material 262, such as a silicon dioxide material and the like, may be provided. Furthermore, the device 200 may be exposed to an etch ambient 263 in order to selectively remove the electrode material 214 (FIG. 2i), which may be accomplished by well-established etch recipes, for instance based on TMAH and the like. For this purpose, the interlayer dielectric material 260 may be formed on the basis of any well-established process techniques, followed by a planarization sequence for exposing the gate electrode structures 235A, 235B in order to perform the etch process 263. During the process 263, the metal-containing electrode material 213 may act as an efficient etch stop material, thereby maintaining integrity of the dielectric layer portions 210A, 210B. Thereafter, a further conductive electrode material, indicated by the dashed lines 236, may be filled in to provide superior overall conductivity of the gate electrode structures 235A, 235B. Hence, the gate electrode structures 235A, 235B may have a very similar configuration, i.e., the dielectric gate materials 210A, 210B followed by the first metal-containing electrode material 213 and a second highly conductive electrode material, such as a metal-containing material 236.

As a result, the present disclosure provides semiconductor devices and manufacturing techniques in which the diffusion of work function adjusting metal species may be performed prior to actually patterning the gate electrode structures. For this purpose, the corresponding diffusion layers and any cap materials may be removed after the anneal process and may be replaced by a metal-containing electrode material that is commonly provided for both transistor types. Hence, the further deposition of any further gate materials and the patterning thereof may be performed on the basis of substantially the same conditions for N-channel transistors and P-channel transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a gate dielectric material above a first active region of a semiconductor device;
   forming the gate dielectric material above a second active region of a semiconductor device;
   forming a first metal-containing material selectively above the gate dielectric material in said first active region;
   forming a second metal-containing material above the gate dielectric material in said second active region;
   performing a heat treatment so as to initiate diffusion of a first species from said first metal-containing material into said gate dielectric material above said first active region and so as to concurrently initiate diffusion of a second species from said second metal-containing material into said gate dielectric material above said second active region;
   removing said first and second metal-containing materials to expose the gate dielectric material above the first and second active regions;
   forming a layer of gate electrode material above said gate dielectric material after removing said first and second metal-containing materials; and
   forming a first gate electrode structure above said first active region and a second gate electrode structure above said second active region from said layer of gate electrode material.

2. The method of claim 1, wherein said layer of gate electrode material comprises a metal-containing electrode material.

3. The method of claim 1, further comprising forming a protection layer above said first and second metal-containing materials and performing said heat treatment in the presence of said protection layer.

4. The method of claim 1, wherein forming said first metal-containing material comprises forming a first diffusion layer containing said first species above said layer of gate dielectric material and forming a cap layer on said first diffusion layer.

5. The method of claim 4, wherein said cap layer is formed with a thickness of approximately 10 nm or less.

6. The method of claim 5, further comprising forming a bottom cap layer on said gate dielectric material.

7. The method of claim 6, wherein said bottom cap layer is formed with a thickness of approximately 3 nm or less.

8. The method of claim 1, wherein forming said gate dielectric material comprises forming a high-k dielectric material above said first and second active regions.

9. The method of claim 1, further comprising forming a threshold adjusting semiconductor alloy on said first active region prior to forming said gate dielectric material.

10. The method of claim 1, wherein said heat treatment is performed at a temperature of approximately 800° C. or higher.

11. The method of claim 1, wherein said first metal-containing material comprises aluminum.

12. The method of claim 11, wherein said first metal-containing material is formed as an aluminum layer having a thickness of approximately 1-20 Å.

13. The method of claim 1, wherein said second metal-containing material comprises lanthanum.

14. The method of claim 13, wherein said second metal-containing material layer is provided as a lanthanum layer having a thickness of approximately 1-20 Å.

15. The method of claim 1, further comprising replacing at least a portion of said gate electrode material in said first and second gate electrode structures with a metal-containing material after forming drain and source regions in said first and second active regions.

16. A method, comprising:
   forming a gate dielectric material above a first active region of a semiconductor device;
   forming the gate dielectric material above a second active region of a semiconductor device;
   forming a first metal-containing material selectively above said first active region, wherein forming said first metal-containing material comprises forming a first diffusion layer containing said first species above said gate dielectric material and forming a cap layer on said first diffusion layer
   forming a second metal-containing material above said second active region, wherein forming said second metal-containing material comprises removing said cap layer and said first diffusion layer from above said second active region and forming a second diffusion layer containing said second species above said first active region and on said cap layer above said first active region;
   performing a heat treatment so as to initiate diffusion of a first species from said first metal-containing material into said gate dielectric material above said first active region and so as to concurrently initiate diffusion of a second species from said second metal-containing material into said gate dielectric material above said second active region;
   removing said first and second metal-containing materials to expose the gate dielectric material above the first and second active regions;
   forming a layer of gate electrode material above said gate dielectric material after removing said first and second metal-containing materials; and
   forming a first gate electrode structure above said first active region and a second gate electrode structure above said second active region from said layer of gate electrode material.

17. The method of claim 16, further comprising forming a second cap layer on said second diffusion layer.

18. The method of claim 17, wherein said second cap layer is formed with a thickness of approximately 10 nm or less.

19. A method of forming gate electrode structures of a semiconductor device, the method comprising:
   diffusing an aluminum metal species from an aluminum-containing material into a first portion of a gate dielectric material and concurrently diffusing a lanthanum metal species from a lanthanum-containing material into a second portion of said gate dielectric material, said first portion of the gate dielectric material being formed above a first active region and said second portion of the gate dielectric material being formed above a second active region;
   removing the aluminum-containing material and the lanthanum-containing material to expose said first and second portions of said gate dielectric material after diffusing said aluminum metal species and said lanthanum metal species, said material comprising said aluminum metal species and said lanthanum metal species;

forming an electrode material commonly above said first and second portions of said gate dielectric material;

forming a first gate electrode structure from said electrode material and said first portion of said gate dielectric material; and forming a second gate electrode structure from said electrode material and said second portion of said gate dielectric material.

20. The method of claim 19, wherein diffusing said first and second metal species comprises performing an anneal process at a temperature of approximately 900° C. and higher.

21. The method of claim 20, further comprising forming drain and source regions in said first and second active regions by applying a second anneal process performed at a temperature that is less than the temperature of said anneal process.

* * * * *